United States Patent [19]

Jorgensen et al.

[11] Patent Number: 5,649,064

[45] Date of Patent: Jul. 15, 1997

[54] SYSTEM AND METHOD FOR MODELING THE FLOW PERFORMANCE FEATURES OF AN OBJECT

[75] Inventors: Charles Jorgensen, Los Altos; James Ross, Oakland, both of Calif.

[73] Assignee: The United States of America as represented by the Administrator of the National Aeronautics and Space Administration, Washington, D.C.

[21] Appl. No.: 446,071

[22] Filed: May 19, 1995

[51] Int. Cl.$^6$ .................................................. G06F 15/18

[52] U.S. Cl. .............................. 395/22; 395/21; 395/905; 73/147

[58] Field of Search ........................ 395/21, 22, 23, 395/24, 902, 905, 906, 907; 364/148, 149, 152, 578; 73/147

[56] References Cited

U.S. PATENT DOCUMENTS

| | | | |
|---|---|---|---|
| 5,282,261 | 1/1994 | Skeirik | 395/22 |
| 5,305,235 | 4/1994 | Izui et al. | 395/22 |
| 5,307,260 | 4/1994 | Watanabe et al. | 395/22 |
| 5,349,541 | 9/1994 | Alexandro, Jr. et al. | 395/21 |
| 5,353,207 | 10/1994 | Keeler et al. | 395/23 |
| 5,377,307 | 12/1994 | Hoskins et al. | 395/22 |
| 5,396,415 | 3/1995 | Konar et al. | 395/21 |
| 5,404,423 | 4/1995 | Uchiyama et al. | 395/22 |
| 5,461,699 | 10/1995 | Arbabi et al. | 395/22 |
| 5,521,814 | 5/1996 | Teran et al. | 395/21 |

OTHER PUBLICATIONS

Oda et al., "Application of neural network to fluctuating aerodynamic noise relation between body shape and sensory test on driving condition," Society of Automotive Engineers of Japan (JSAE), pp. 5–8 Apr. 1995.

Rao, "Modeling nonlinear features of V tail aircraft using MNN" IEEE Transactions on Aerospace and Electronic Systems, vol. 31 issue 2 pp. 841–846 Apr. 1995.

Principe et al, "System Identification with Dynamic Neural Networks" Proceeding, World Congress on Neural Networks, vol. 2 pp. 284–289 Dec. 1994.

(List continued on next page.)

*Primary Examiner*—David K. Moore
*Assistant Examiner*—Jeffrey Smith
*Attorney, Agent, or Firm*—Kenneth L. Warsh; Harry Lupuloff; John G. Mannix

[57] ABSTRACT

The method and apparatus includes a neural network for generating a model of an object in a wind tunnel from performance data on the object. The network is trained from test input signals (e.g., leading edge flap position, trailing edge flap position, angle of attack, and other geometric configurations, and power settings) and test output signals (e.g., lift, drag, pitching moment, or other performance features). In one embodiment, the neural network training method employs a modified Levenberg-Marquardt optimization technique. The model can be generated "real time" as wind tunnel testing proceeds. Once trained, the model is used to estimate performance features associated with the aircraft given geometric configuration and/or power setting input. The invention can also be applied in other similar static flow modeling applications in aerodynamics, hydrodynamics, fluid dynamics, and other such disciplines. For example, the static testing of cars, sails, and foils, propellers, keels, rudders, turbines, fins, and the like, in a wind tunnel, water trough, or other flowing medium.

15 Claims, 6 Drawing Sheets

OTHER PUBLICATIONS

Turkkan et al., "Prediction of wind load distribution for air-supported structures using neural networks" Canadian Journal of Civil Engineering, vol. 22 issue 3 pp. 453–461 Jun. 1995.

Korneeva et al., "Some problems on intelligence of wind tunnel testing" ICIASF '89: Instrumentation in Aerospace Simulation Congress Dec. 1989.

Cantwell et al., "Intelligent data acquisition system for fluid mechanics research" Experiments in Fluids, vol. 8 No. 3–4 pp. 233–236 Dec. 1989.

Singh, "Neural network modeling of the flow field around 2-d automotive shapes", Neural Networks in Manufacturing and Robotics, American Society of Mechanical Engineers, vol. 57, pp. 155–163 Dec. 1992.

Khanduri et al., Development of a Hybrid KBS for Design application in wind engineering; Restructuring–America and Beyond, Part 2 pp. 1427–1430 Dec. 1995.

"Modeling of Damaged Aircraft Using Artificial Neural Networks," Equipment & Materials Update; NIEQMT IAC–Newsletter Database, vol. 96 issue 6 Jun. 1996.

Kornjeeva, "Some problems on intelligence of wind tunnel testing," IEEE ASE Magazine vol. 5 issue 2 Feb. 1990.

Turkkan, "Prediction of wind load distribution for air supported structures using neural networks," Canadian journal of civil engineering vol. 22 No. 3 pp. 453–461 Dec. 1995.

Napolitano, "Aircraft failure detection and identification using neural networks," ournal of guidance, control and dynamics, vol. 16, No. 6 p. 999 Dec. 1993.

Rodman, "The use of knowledge–based systems for aerodynamics technology transfer," AIAA aerospace sciences meeting Jan. 1991.

Decker, "Wind tunnel operations using archival flow visualization records and artificial neural networks," AIAA Aerospace sciences meeting, paper 94–0390 Jan. 1994.

Ching, "An integrated knowledge system for wind tunnel testing, project engineers intelligent assistant," AIAA Aerospace sciences meeting, paper 93–560 Jan. 1993.

Fan, "Applying neural networks in laminar flow control," Proceeding of modern techniques and measurements in fluid flows pp. 326–331 Dec. 1994.

Todoroki, "Research on smart structures or detecting cracks using neural networks," Nippon kaikai gakkai ronbunshu, transactions of the Japan society of mechanical engineers, vol. 60 No. 570 p. 580 Dec. 1994.

Brunger, "Modeling of damaged aircraft using artificial neural networks," Master's thesis, Naval postgraduate school, 1994 Dec. 1994.

Linse, Dennis J. and Robert F. Stengel, "Identification of Aerodynamic Coefficients Using Computational Neural Networks" *Journal of Guidance, Control, and Dynamics* vol. 16, No. 6, Nov.–Dec. 1993.

Faller, William E., Scott J. Schreck and Marvin W. Luttges, "Real–Time Prediction and Control of Three–Dimensional Unsteady Separated Flow Fields Using Neural Networks," American Institute of Aeronautics and Astronautics, 32nd Aerospace Science Meeting & Exhibit, Jan. 10–13, 1994.

SYSTEM AND METHOD FOR MODELING THE FLOW PERFORMANCE FEATURES OF AN OBJECT

ORIGIN OF INVENTION

The invention herein was made by employees of the United States Government and may be manufactured and used by or for the Government for governmental purposes without payment of any royalties thereon or therefore.

BACKGROUND OF THE INVENTION

1. Technical Field of the Invention

This invention relates generally to the field of modeling the flow features of an object and more specifically to a nonlinear system and method for modeling the aerodynamic performance features of an object in a wind tunnel.

2. Description of the Prior Art

During the design and development of new aircraft, wind tunnels are used to generate performance data of the aircraft, or portions of the aircraft. Given a sufficient amount of performance data, a computer model of the aircraft performance can be constructed from the performance data. The model is then used to further test and refine the design and development of the aircraft.

From conception to completion, a significant amount of time may be invested in wind tunnel testing. Typically many mock-up portions of the aircraft are tested (e.g., wings, nose, tail, fuselage, or the entire aircraft), and each portion may be tested in varying sizes, e.g., 5%, 10%, 20%, 50%, etc. For each test, the aerodynamic effects of a plurality of geometric configurations and independent variables associated with the object being tested are performed. Such independent variables include, for example, flap positions (leading and trailing edge), slat positions, deflection angles, elevator deflections, rudder deflections, stabilizer position, roll, pitch, and yaw positions, angle of attack, and permutations of such geometric configurations, and power settings such as mach number and velocity (collectively referred to as geometric configurations). For each independent variable, a plurality of dependent variables or physical measurements of the object are made using an elaborate "scale" or balance system attached to the object under test. Such dependent variables include, for example, coefficients of lift, drag, side-force, pitching moment, yawing moment, and rolling moment ($C_L$, $C_D$, $C_Y$, $C_M$, $C_N$, $C_b$ respectively), lift, and other similar physical measurements.

Given the test performance data, a model is developed through extensive manual data fitting, analysis, and interpolation to derive values between the actual measurements taken. Evaluation of the aircraft design is generally based on a visual inspection of the fitted curves produced. Cross-plots from different wind tunnel runs are combined to assemble the appropriate data to model the aircraft in flight. Most of the data is fit by simple polynomials, limited to 1 or 2 variables taken at a time. If the engineer needs to have curve fits for many variables at once, a linear interpolation of the data is performed. However, a simple linear interpolation may produce errors if there is insufficient data to determine accurate minima and maxima. In addition, this post-test analysis is very labor intensive, specific to each model and test, and requires large amounts of computing power and time.

Modeling of aircraft requires an exceptionally high degree of accuracy, mainly for safety reasons. In order to achieve sufficient accuracy in modeling the aircraft, over-testing is performed so that potentially important data is not lost. Large scale wind tunnel test time is extremely expensive—typically about $6,000 per hour. Thus, any decrease in the amount of wind tunnel test time would result in a significant cost reduction in the design and development of the aircraft, and a decrease in the design cycle time.

Once a model is developed, aircraft developers may use the model to determine the optimal geometric configuration of the aircraft for a particular flight regime. For example, the geometric configuration of a transport aircraft may be optimized for lift so as to reduce required wing area. This optimization problem is generally very nonlinear. Thus, the linear solutions of the prior state of the art are often inadequate. In addition, using the prior art methods of modeling, a model is not readily available during testing. The model is created much later in the design process. Thus, after the post-test analysis is complete, subsequent wind tunnel tests are required to focus on interesting points in the aircraft design. This results in increased expense and design time.

It would be desirable to provide an efficient, accurate, and robust system and method for testing aircraft in wind tunnels by which the number of configurations tested is minimized, the model provides a good representation of "in between" or missing configurations, the post-testing analysis to generate a model is eliminated or significantly simplified, and the generated model reflects inherent nonlinearities. In addition, it would be desirable to provide a model in "real time" so that wind tunnel testing can be modified "on the fly" to focus on interesting points (e.g., maximal lift).

SUMMARY OF THE INVENTION

A neural network is used to generate a model of the flow performance features of an object (e.g., an aircraft or portions thereof) in a wind tunnel from performance data on the object. The neural network is specifically constructed and adapted to perform with a high degree of accuracy in aerodynamic modeling applications.

Initial pairs of test input signals or conditions (e.g., flap positions, slat positions, deflection angles, elevator deflections, rudder deflections, stabilizer position, roll, pitch, and yaw positions, angle of attack, power settings, and permutations of such geometric configurations), and test output conditions (e.g., lift, drag, side-force, pitching moment, yawing moment, and rolling moment, and other similar physical measurements) are used to train the neural network.

Various learning methods or modules are used in the present invention. For example, a modified Levenberg-Marquardt optimization method, an average generalization error, a cost function with a regularization parameter, and a mixture of experts paradigms are used in the present invention. As wind tunnel testing proceeds, the neural network learns a complete static aerodynamic model of the object. When the model attains a sufficient level of accuracy, learning is completed.

Because the model is generated simultaneously with the wind tunnel testing procedure, the model can be immediately used to dynamically adjust the test procedure to focus on interesting points. For example, the model can be used to determine optimal geometric configurations of maximum lift, high alpha performance, or other flight performance features. Test procedures can then be immediately implemented that verify the optimal geometric configurations. Thus, a separate wind tunnel test at a later date is not required.

The invention can also be applied in other similar flow modeling applications in aerodynamics, hydrodynamics, and other such disciplines. For example, the testing of cars, sails, and foils, propellers, keels, rudders, turbines, fins, and the like in a wind tunnel, water trough, or other flowing medium.

DETAILED DESCRIPTION OF THE INVENTION

Neural Networks Overview

Figure 1:
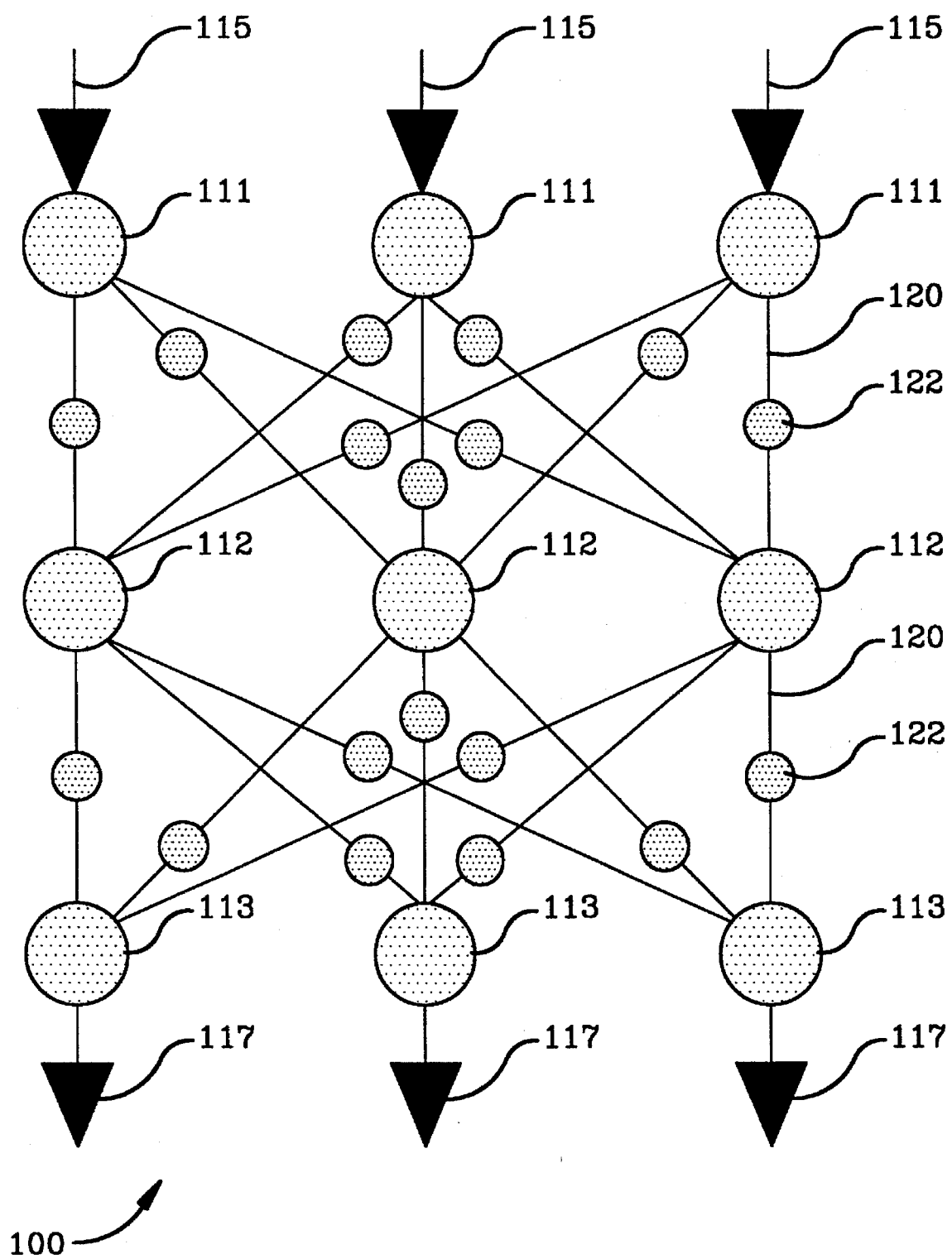
FIG. 1 is a graphical illustration of a conventional neural network.

Referring now to FIG. 1, a neural network 100 comprises a collection of cells, also called nodes or neurons 111, 112, 113, and connections 120 among the nodes. Nodes are generally classified into three types or layers: input 111, output 112, and hidden 113. Nodes in the input layer 111 receive input signals 115 from sources external to the network. Nodes in the output layer 112 send output signals 117 from the network but, in practice, and as seen in FIG. 1, the output signals 117 are sent by hidden nodes 113. Within the network, hidden nodes 113 are connected to input nodes 111, output nodes 112 and/or other hidden nodes 113 (e.g., in a multi-layer network). In the example shown in FIG. 1, the network is "fully interconnected" in that each node in one layer is connected to every other node in the succeeding layers. A network need not be fully interconnected.

Each connection 120 between two nodes has an associated value, called a weight 122. Weights 122 may be either positive or negative. In one embodiment weights 122 are normalized to values between −1 and 1.

Figure 2:
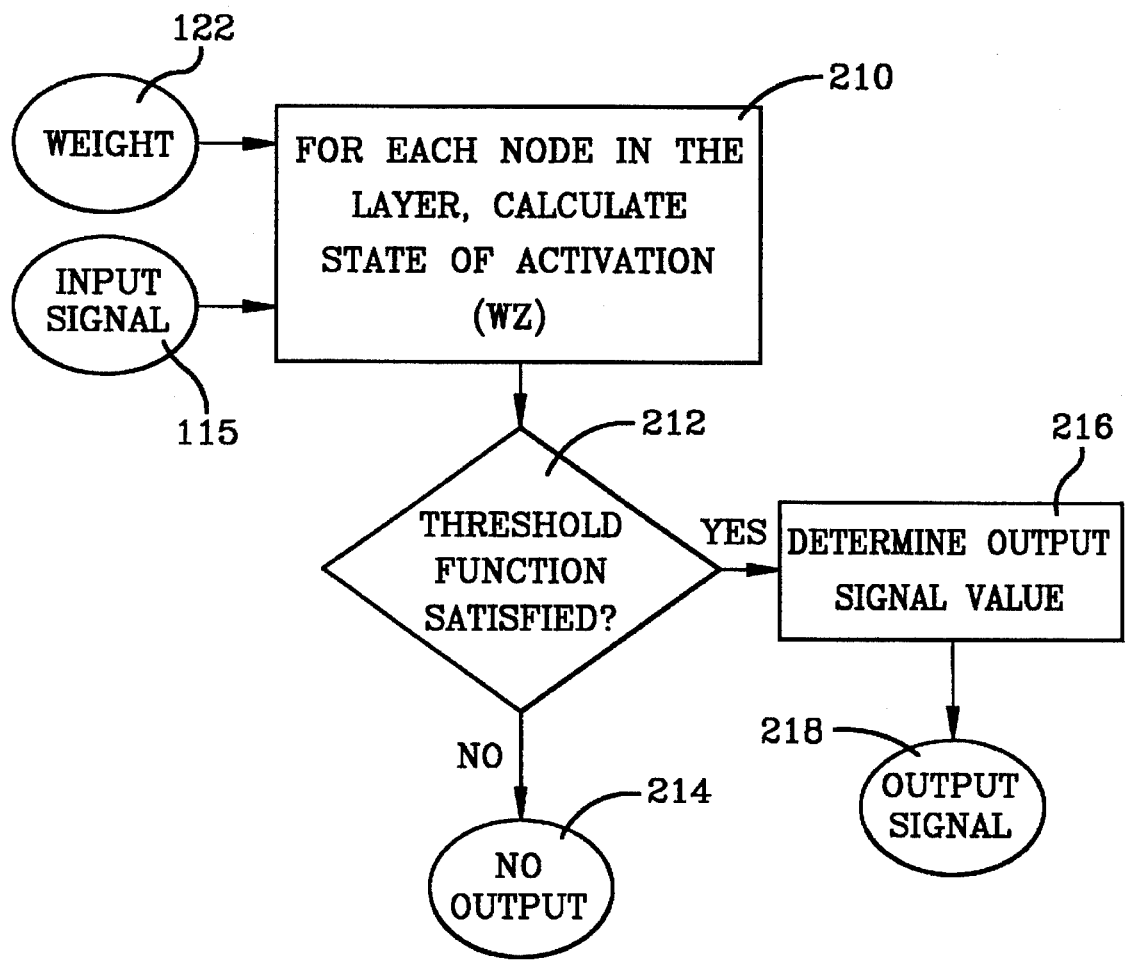
FIG. 2 is a flow chart of a conventional method for evaluating a neural network.

Referring additionally now to FIG. 2, a high level flow-chart of the operation of a neural network is shown, wherein functions are indicated by reference numbers which are sometimes referred to herein without stating the associated nomenclature shown in the related box thereof. Each node calculates a "state" value based on output signals (positive or negative) from nodes in the layer below, and the associated weight 122 of the connection 210. The calculation of the state of the node is governed by an associated activation function. A typical activation function is the summation of the products of each output signal, $x_i$, multiplied by the associated weight value, $w_i$, 122 expressed as:

$$\Sigma w_i x_i \quad (1)$$

If a threshold state is achieved (see block 212), the node will "fire" an output signal to connected nodes in the next layer above (the threshold may also be 0). Otherwise no output from the node is made (see block 214). An output function associated with the node maps the state of the node 216 to an output signal 218. Typical output functions are linear, linear threshold, step, or a sigmoid function.

The nodes in the next layer behave in the same fashion—i.e., calculate the node state based on input signal and weighted connections, and "fire" an output signal if a threshold is achieved.

Figure 3:
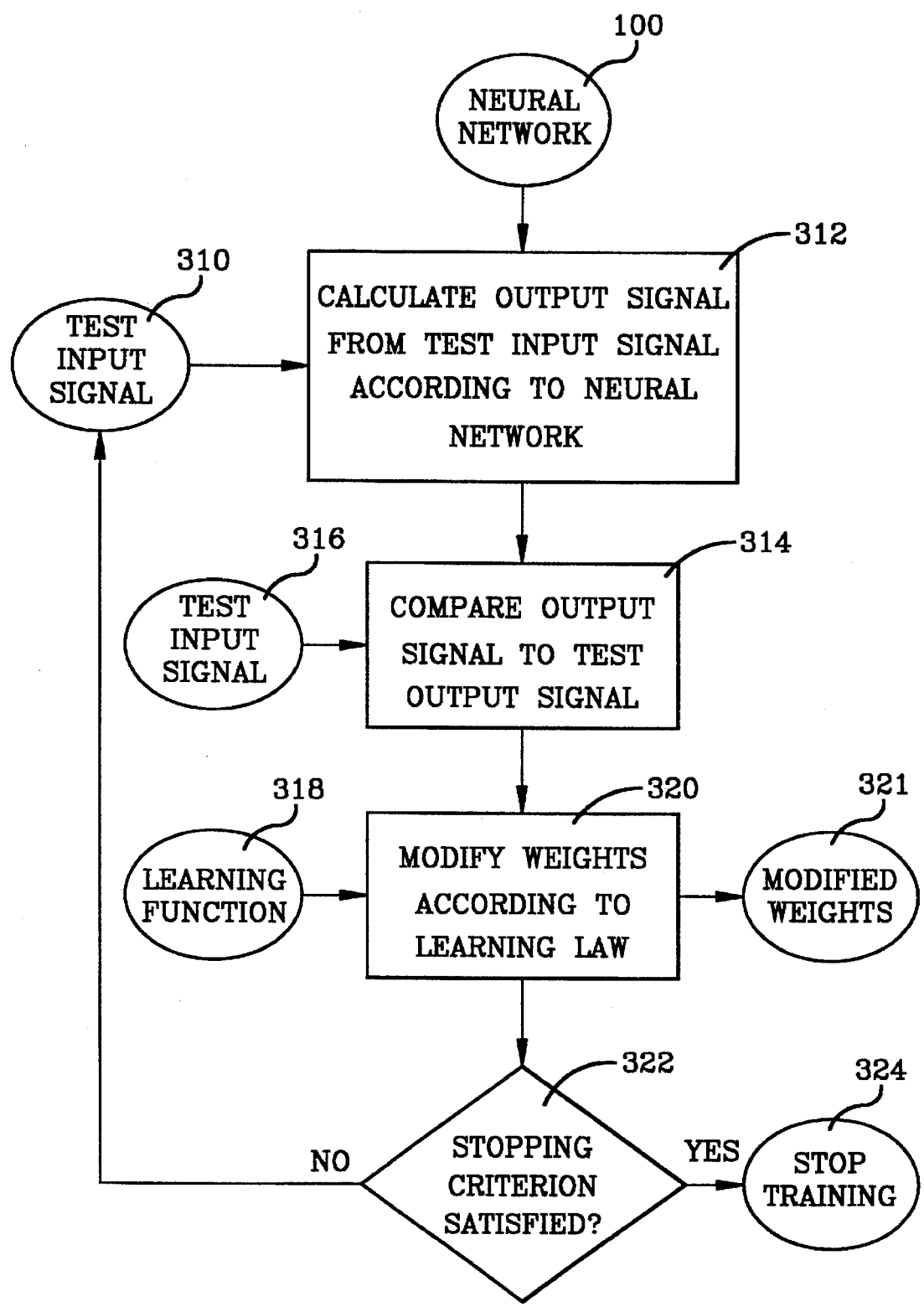
FIG. 3 is a flow chart of a conventional method for training a neural network.

Referring now to FIG. 3, the neural network 100 is "trained" by presenting test input signals 310 to each of the input nodes and calculating an output signal according to the network indicated in block 312 (see FIGS. 1, 2). The calculated output signal is compared (see block 314) to a known or measured test output signal 316. The set of test input signals 310 and test output signals 316 together comprise a training set. Based on the comparison step 314, a learning function 318 makes internal adjustments to the weights associated with the connections (see block 320) in a conventional manner to generate modified weights (see block 321). Typical learning functions 318 include the Back Propagation Learning rule, Modified Delta Rule, Kohonen Self Organization, and the like.

A stopping criterion is checked to determine if further training is required (see block 322). Typical stopping criteria are based on a measurement of the error between the calculated output and the test output signal, or if the number of iterations exceeds a certain number. If a stopping criterion is satisfied, training is complete (see block 324), otherwise another test input value is passed to the network and the method is repeated. After training, the network can be used to respond to random input signals (i.e., input for which there is no corresponding desired output supplied), and can be used for further modeling analysis.

Figure 4:
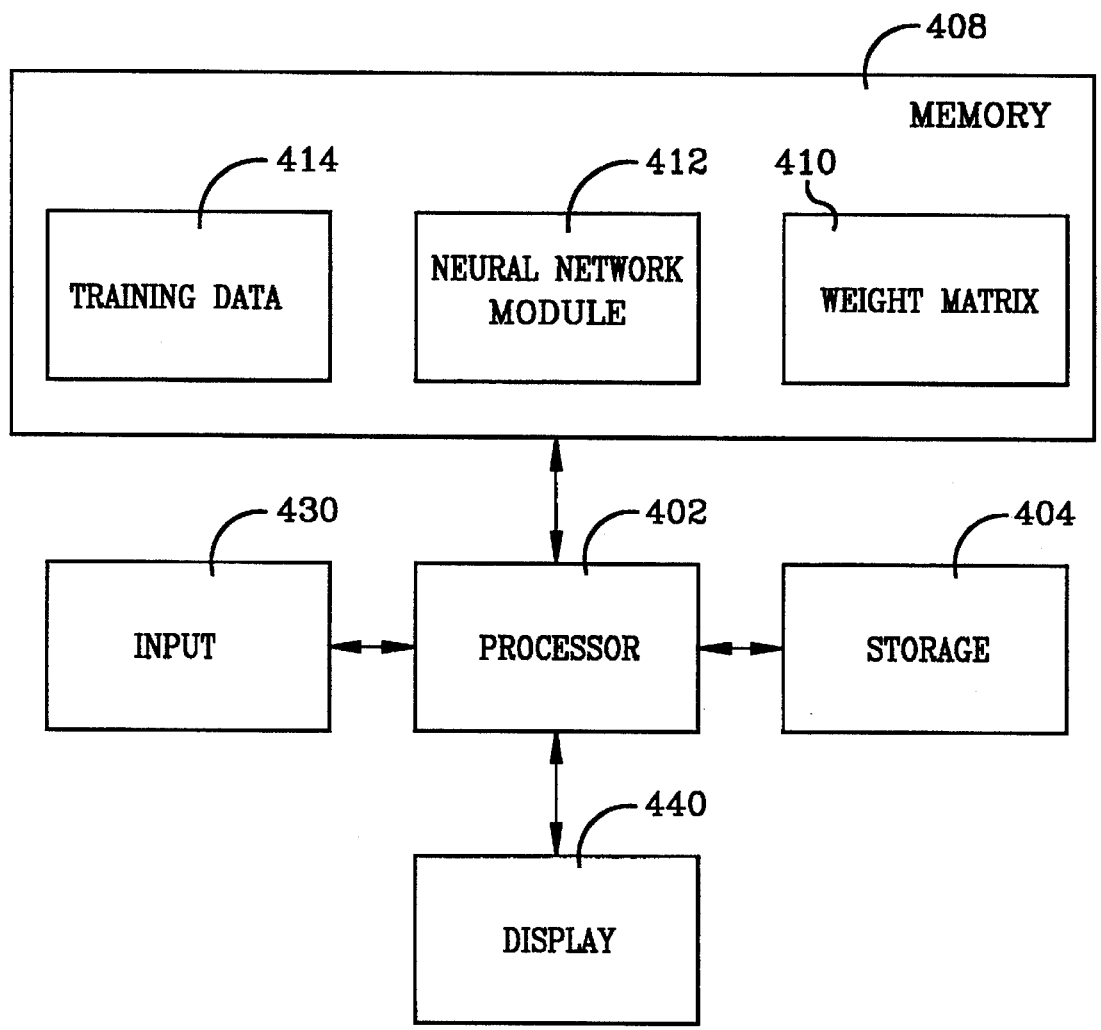
FIG. 4 is a block diagram of software and hardware components for implementing one embodiment of the present invention.

Neural networks can be implemented in computer hardware or simulated in software. Large collections of nodes and connections are conventionally represented by matrices. In one embodiment, the present invention is implemented using the hardware and software components shown in FIG. 4. Processor 402 is a conventional engineering workstation or other computer processor such as an Intel 80×86 or Pentium central processing unit (CPU), Motorola 680×0 CPU, RISC CPU, and the like. Processor 402 may also be coupled to other processors accessible over conventional communications channels or buses (not shown). Processor 402 is conventionally coupled to storage 404 which may be a magnetic disk storage, a CD storage unit, or other conventional computer data storage unit. Storage 404 may also be coupled to other storage units accessible over conventional communications channels or buses (not shown).

Processor 402 is also conventionally coupled to memory 408 which is a random access memory (RAM) unit or other conventional computer memory. Items in memory 408 may alternatively be stored in storage 404 and accessed by processor 402 when required. Memory 408 comprises weight matrix 410 for storing the structure of the neural network nodes, connections, and weight values associated with the connections. Memory 408 also comprises neural network module 412 for defining the operation of the neural network 100, for example, activation functions and output functions, executable on processor 402, that define the operation of the nodes 111, 112, 113 and connections 120. Memory 408 also comprises training data 414 comprising test input signals and corresponding test output signals for training the neural network.

Input means comprises conventional input devices such as a keyboard, mouse, track-ball, touchscreen, or other similar electronic input means 430. A conventional display unit, output cable, oscilloscope, printer, or other electronic signal output means may also be coupled to processor 402.

The preferred embodiment of the present invention may be implemented on any platform, operating system, and user interface such as: IBM PCs or Compatibles running Microsoft Windows; Sun Microsystems workstations running Sun OS-SunView; or, DEC VAX running VMS, and the like. One embodiment uses MATLAB (as a programming toolbox) on a Silicon Graphics Indigo EXtream II computer. Such systems may be operated in a distributed data/distributed processor environment, if desired.

Wind Tunnel Testing Overview

Wind tunnels are used to measure a number of performance features of aircraft designs. Typically a scale model of a proposed aircraft is subjected to wind tunnel testing, for example a 50% scale model of the NASA SHARC research aircraft (Super High Alpha Research Concept). Separate sections of the aircraft, such as a wing, tail, fuselage, may also be tested independently. Similar static testing is used in other flow modeling applications in aerodynamics, hydrodynamics, fluid dynamics, and other such disciplines (collectively referred to as flow dynamics). For example, the static testing of cars, sails, foils, propellers, keels, rudders, turbines, fins, and the like in a wind tunnel, water trough, or other flowing medium.

Performance features, or any static dependent variable, of the object under test include, for example, lift, drag, lift/drag ratio, side-force, pitching moment, yawing moment, rolling moment, coefficient of momentum, center of mass, maximum lift, high alpha performance, and other similar static physical measurements. These features are measured via a "scale" or balance system attached to the object in the wind tunnel.

The performance features vary as a function of a plurality of geometric configurations, or any independent variables, associated with the object. Such independent variables may include, for example, flap positions, slat positions, deflection angles, elevator deflections, rudder deflections, stabilizer position, roll, pitch, and yaw positions, angle of attack, and permutations of such geometric configurations, power settings such as mach number and velocity, or other independent variables.

Flow Modeling Neural Network Architecture

According to the present invention, a model of an object in a wind tunnel is generated from a neural network having input nodes corresponding to a plurality of geometric configurations of an object in a wind tunnel, and output nodes corresponding to one or more performance features of the object.

Figure 5:
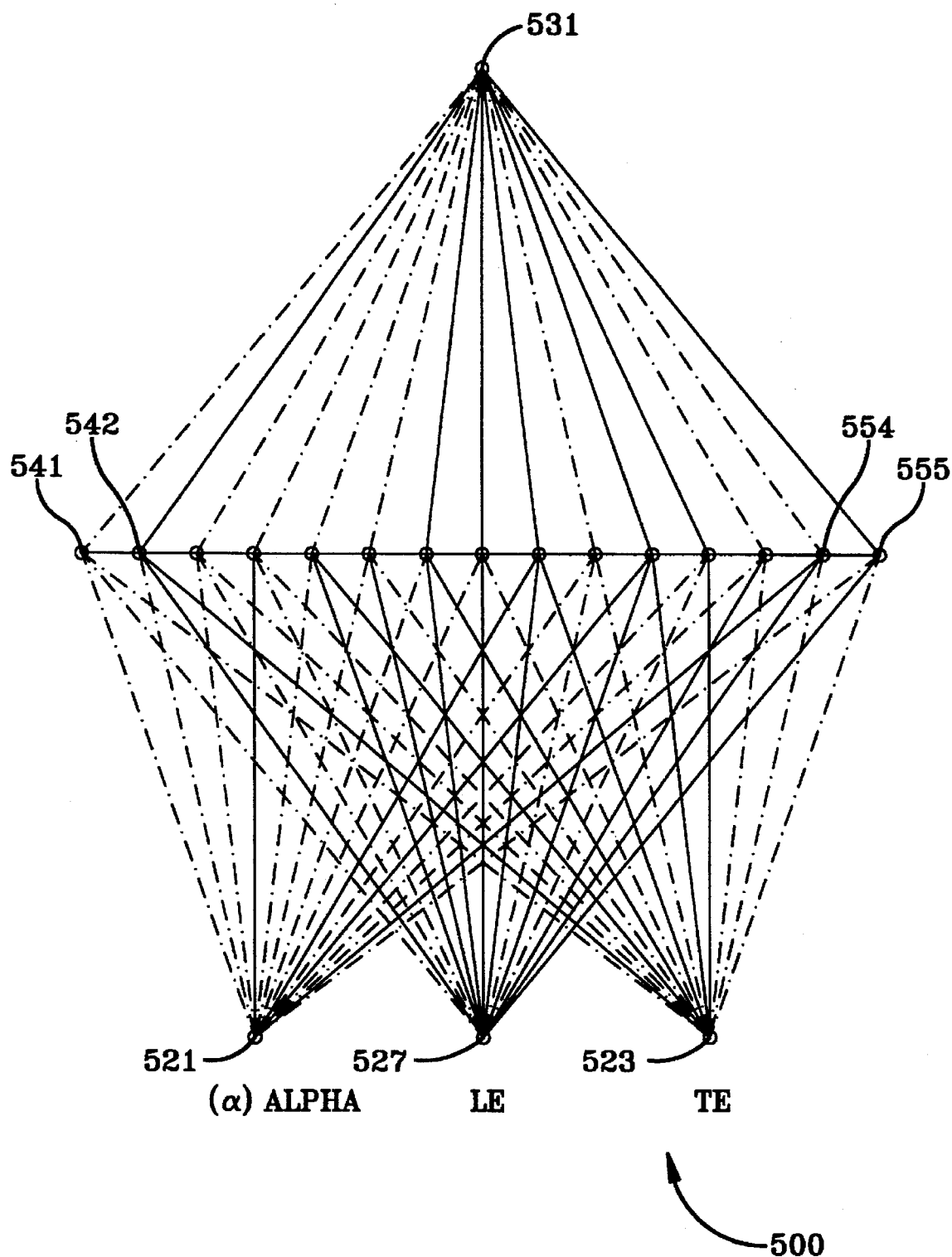
FIG. 5 is a graphical illustration of one embodiment of the neural network in the present invention.

Referring now to FIG. 5, one embodiment of neural network 500 is shown. The three input nodes 521, 522, 523 correspond to the geometric configurations of, for example, angle of attack ($\alpha$), leading edge flap position (LE) and trailing edge flap position (TE). In one embodiment, LE and TE are each tested in six distinct positions (thus there are 36 possible LE and TE flap combinations), and $\alpha$ is varied in 16 positions for each of the 36 flap settings. In one embodiment, all input signals are scaled to variance 1 (e.g., using a conventional sigmoid function).

One output node 531 corresponds to a performance feature associated with the object, for example the coefficient of drag ($C_D$), coefficient of lift ($C_L$), pitching moment ($C_M$), or Lift to Drag ratio (L/D). A plurality of performance features can be simultaneously predicted from a plurality of input nodes associated with a plurality of geometric configuration nodes in one network. However, for clarity and simplicity, one embodiment of the present invention predicts or estimates each performance feature via a separate neural network with one output node. The output node is governed by a linear output function of the form $$F_j(x)=x. \tag{2}$$

A conventional sum of products of the weight and the input is used for an activation function ($\Sigma w_i x_i$). In one embodiment, all output signals are scaled to variance 1.

In this embodiment, 15 hidden nodes, generally indicated at 541–555, are each governed by a tangent hyperbolic activation function of the form $$f_i(x)=\tanh(x). \tag{3}$$

The size of the number of data measurements or data points in the data set imposes an upper limit on how many weights the network should contain. In general, the number of data points must exceed the number of weights to ensure that generalization is achieved.

Training

The training step determines the weight values 122 in network 500 from a set of test measurement data. Measurement data comprises historical or known test inputs signals 310 and corresponding test output signals 316 (see FIG. 3). The set of paired test input and test output signals is referred to as the training set. In the present invention, a training set may comprise, for example, historical or recorded data on geometric configuration input signals 521, 522, 523 and corresponding performance feature output signal 531 associated with an object in a wind tunnel.

During training, various combinations of test geometric configuration input signals 521, 522, 523 are iteratively inputted to the neural network, 500, and a performance feature output signal 531 is measured. According to an iterative learning method, adjustments are made to the weight connections as a function of the measured performance feature output signal and the known test performance feature output signal 531 corresponding to the input signals 521, 522, 523.

A performance feature, y (e.g., drag, lift, L/D, etc.) output signal 531, varies as a function, g, of a plurality of geometric configurations, $\phi$ e.g., angle of attack ($\alpha$), leading edge flap angle (LE), and trailing edge flap angle (TE) 521, 522, 523. This is expressed as:

$$y=g_0(\phi) \tag{4}$$

Measurement errors may also be reflected in one additive noise term, e $$y=g_0(\phi)+e \tag{5}$$

The function g is unknown. However, the training set, $Z^N$, provides a set of known (y, $\phi$) pair measurements, expressed as:

$$Z^N=\{[\phi^i, y^i]; i=1, K, N\} \tag{6}$$

Training set, $Z^N$, is used to train neural network 500 to predict the performance feature, y, from $$y'=g'(\phi) \tag{7}$$

The predictor is found from the training set, $Z^N$. Expressed in mathematical terms, the network 500 will find a mapping from the set of measurements, $Z^N$, to the set of functions contained in the chosen network architecture $g(\phi;\theta)$ $$Z^N \to \theta' \qquad (8)$$

so that value of y' is close to the true value of y, where $\theta$ is the parameter vector of the network (i.e., a vector containing all adjustable parameters of the network in a weight matrix). The mean square error cost function is used to determine the quality of the predictor (e.g., how "close" y' is to y), and is expressed as:

$$V(\theta) = \frac{1}{2N} \sum_{i=1}^{N} (y^i - y^i(\theta))^2 = \frac{1}{2N} \sum_{i=1}^{N} (\epsilon^i(\theta))^2 \qquad (9)$$

In another embodiment, a relative absolute error cost function is used.

In mathematical terms, training of network 500 is an unconstrained optimization or minimization of the error cost function. This optimization problem can be solved using conventional nonlinear training methods, for example, back-propagation, Baysian, Fuzzy Set, Non Linear regression, or other neural network paradigms including mixture of experts, CMACS, Radial Basis Functions, directed search networks, and functional link nets.

In one embodiment of the present invention, an adaptation of a Levenberg-Marquardt method is used for solving the optimization problem (see Mathworks 1993 ("Optimization Toolbox for MATLAB," published by The Math Works Inc.) for application in a conventional statistical optimization problem) of the error cost function. The Levenberg-Marquardt method has several advantages over conventional neural network training methods: speed, guaranteed convergence to a (local) minima, and numerical robustness. The Levenberg-Marquardt method is especially well-suited to the present invention where the data set is small—e.g., on the order of hundreds of data measurements in the training set. In cases where the data set is large, the Levenberg-Marquardt method may be less suitable. In such larger applications, a mixture of experts technique generally gives good results, scales up well, and can handle non-continuous functional regions.

The Levenberg-Marquardt method exists in numerous versions. The simplest version may be found in the original contribution of Marquardt (1963) known in the art. The version adapted in one embodiment of the invention belongs to a class called Trust Region methods discussed in the technical article "Practical Methods of Optimization," published by Wiley and Sons 1987. The Levenberg-Marquardt method used in the present invention is an iterative search scheme defined by $$\theta^{(k+1)} = \theta^{(k)} + \mu^{(k)} h^{(k)} \qquad (10)$$

From the current iterate $\theta^{(k)}$, a new iterate is found by taking a step of size $\mu^{(k)}$ in the direction $h^{(k)}$. Choosing a step size, $\mu^{(k)}$, of 1, simplifies the problem.

Figure 6:
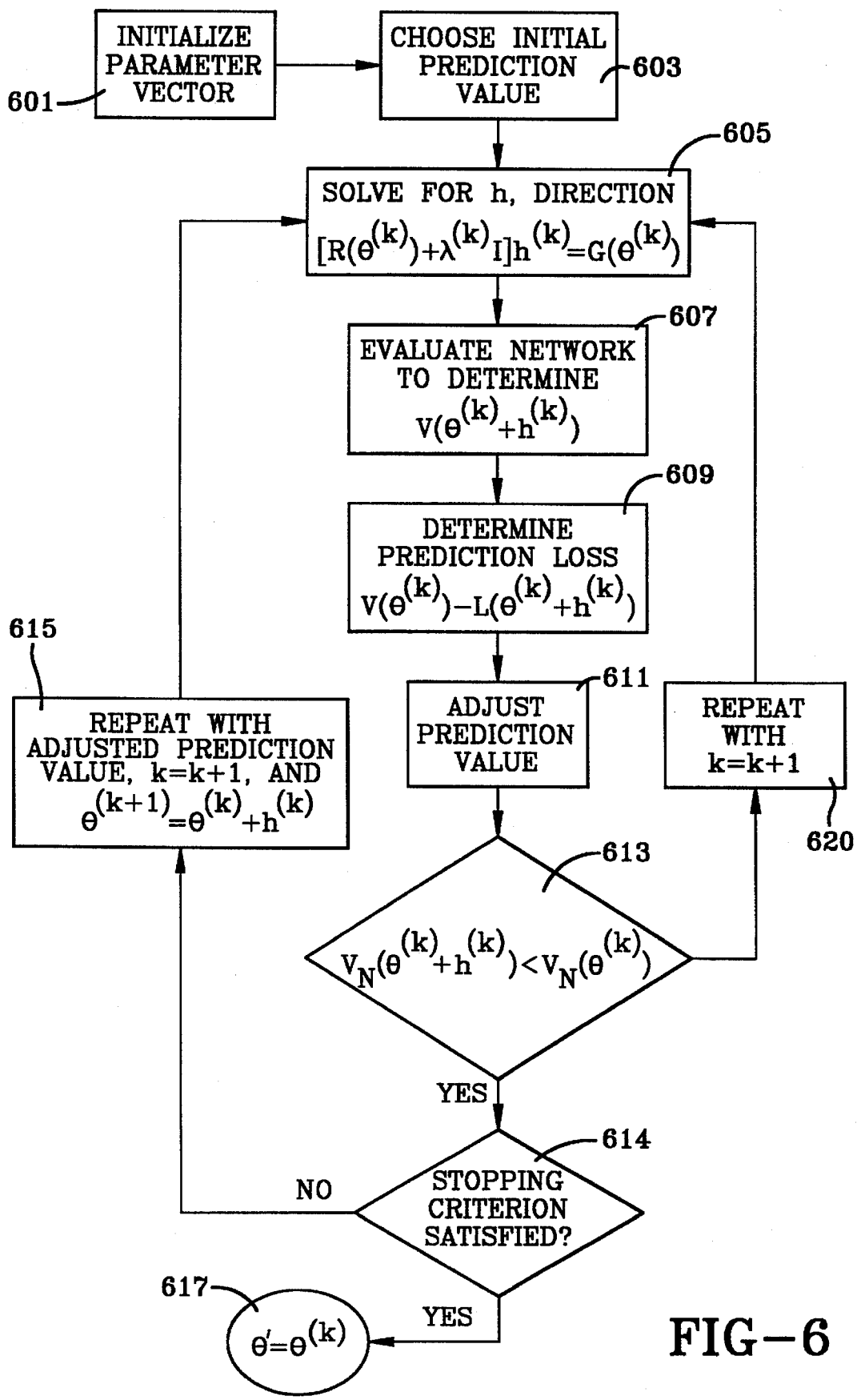
FIG. 6 is a flow chart of the training method of the present invention.

FIG. 6 is a flow chart of the training method used in one embodiment of the present invention. A search direction, $h^{(k)}$ (a vector), is found by initializing a parameter vector $\theta^{(0)}$ (i.e., the weight matrix) (see block 601) and selecting an initial random prediction value $\lambda^{(0)}$ (see block 603). Alternatively, $\lambda^{(0)}$ may be chosen from a Gaussian distribution. The initial parameter vector, $\theta$, may be initialized, for example, with random numbers between $-1$ and $1$. In another embodiment, the parameter vector is initialized with a random Gaussian distribution from $-1$ to $1$. The training step can be run several times starting with different initial parameter vectors. The set of trained weights leading to the lowest minima is then chosen.

The search direction, $h^{(k)}$, is determined (see block 605) by solving $$[R(\theta^{(k)}) + \lambda^{(k)} I] h^{(k)} = G(\theta^{(k)}) \qquad (11)$$

where R represents the Gauss-Newton approximation to the Hessian (V"($\theta$)), and the error metric V" is a vector of second partial derivatives of the Hessian matrix) and is defined by $$R(\theta) \equiv \frac{1}{N} \sum_{i=1}^{N} \psi^i(\theta) (\psi^i(\theta))^T \qquad (12)$$

where $\psi^i(\theta)$ denotes the gradient of the network 500 output signal 531 with respect to each of the weights. When the input is $\psi^i$ $$\psi^i(\theta) = \frac{\partial y^i(\theta)}{\partial \theta} \qquad (13)$$

G($\theta$) in equation 11 is the gradient of the mean square error cost function (eqn. 9), and is expressed as $$G(\theta^{(k)}) \equiv V'(\theta^{(k)}) = \frac{\partial V(\theta)}{\partial \theta} \qquad (14)$$

The gradient of the mean square error cost function can be determined by $$G(\theta) = \frac{1}{N} \sum_{i=1}^{N} \frac{\partial \epsilon^i(\theta)}{\partial \theta} \epsilon^i(\theta) = -\frac{1}{N} \sum_{i=1}^{N} \frac{\partial y^i(\theta)}{\partial \theta} \epsilon^i(\theta) = \qquad (15)$$
$$-\frac{1}{N} \sum_{i=1}^{N} \psi^i(\theta) \epsilon^i(\theta)$$

The network is evaluated, and $V(\theta^{(k)} + h^{(k)})$ is determined (see block 607) as well as a "prediction" (see block 609) of the loss measured by $V(\theta^{(k)}) - L(\theta^{(k)} + h^{(k)})$. Where $L(\theta^k)$ is an estimate of the loss from the Gauss-Newton algorithm, $V(\theta)^k$ is from the mean square error cost function, and h is the search increment.

Next, an adjustment in the prediction value, $\lambda^{(k)}$, is determined (see block 611) as follows:

If $V(\theta^{(k)}) - V(\theta^{(k)} + h^{(k)}) > 0.75[V(\theta^{(k)}) - L(\theta^{(k)} + h^{(k)})]$ then $\lambda^{(k)} = \lambda^{(k)}/2$ (16)

If $V(\theta^{(k)}) - V(\theta^{(k)} + h^{(k)}) < 0.25[V(\theta^{(k)}) - L(\theta^{(k)} + h^{(k)})]$ then $\lambda^{(k)} = 2\lambda^{(k)}$. (17)

For all other values, the initial $\lambda^k$ is retained and only h is changed.

In the above equations, $$[V(\theta^{(k)}) - L(\theta^{(k)} + h^{(k)})] = \frac{1}{2} \left( (h^{(k)})^T G(\theta^{(k)}) + \frac{\lambda^{(k)}}{N} \|h^{(k)}\|_2^2 \right) \qquad (18)$$

If $V_N(\theta^{(k)} + h^{(k)}) < V_N(\theta^{(k)})$ (see block 613) then accept $\theta^{(k+1)} = \theta^{(k)} + h^{(k)}$ as a new iterate, and let $\lambda^{(k+1)} = \lambda^{(k)}$ 615. Otherwise, set k=k+1 (see block 620) and go to the determination of h (eqn. 11 above) and indicated in block 605.

If a stopping criterion (see block 614) is not satisfied then set k=k+1 and repeat the method indicated in block 615 by determining a search direction, h. If a stopping criterion is satisfied indicated in block 617, set $\theta' = \theta^{(k)}$ and terminate. A typical stopping criterion is, for example, where the gradient of the mean square error cost function gets sufficiently close to zero, the mean square error cost function gets below a certain value, or the number of iterations exceeds a certain value. One or more stopping criterion may be used.

If the prediction value $\lambda$ is large, the diagonal matrix will overwhelm the Hessian matric (R) in equation 11. Thus, in the present invention, the search direction, h, approaches the gradient direction, but with a step size close to 0 (similar to the back-propagation method). This is an important property to ensure convergence, since the mean square error cost function always may be minimized by taking small enough steps in the search direction, h, of the gradient. If λ=0 the above method coincides with the Gauss-Newton method. Instead, in the present invention, λ, is decreased if a new iterate leads to a decrease in mean square cost function close to what is predicted using L(θ) ((see block 609), equation 16). Otherwise, λ is increased (609, equation 17).

Further Modifications

In another embodiment of the present invention, a different cost function than the conventional mean square error function (equation 9) is used. Because the measurements in the wind tunnel are corrupted by noise, a better measure of the fit is the mean square error on "all possible" measurements. This measure is known as the generalization error—the ability to predict new measurements, not seen during the training phase—and is expressed as $$\overline{V}(\hat{\theta}) \equiv E\{V(\hat{\theta})\} \quad (19)$$

However, this value is difficult to compute in practice, and does not give information about whether the selected network architecture is a good choice. $\hat{\theta}$ depends on the training set and is thereby a stochastic variable, which in turn means that $\overline{V}(\hat{\theta})$ is a stochastic variable. Taking the expectation of $\overline{V}(\hat{\theta})$ with respect to all possible training sets of size N, yields $$J(M) \equiv E\{\overline{V}(\hat{\theta})\} \quad (20)$$

which is called the average generalization error or the model quality measure (see technical article "System Identification Theory for the User" of L. Ljung, Prentice Hall 1987).

Assuming the existence of set of "true" weights in $\theta_0$ that exactly describe the data-generating function by the chosen network architecture ($g(\phi;\theta_0)=g_0(\phi)$), and assuming the noise contribution is white noise independent of the inputs, an estimate of the average generalization error can be made. This estimate is known as Akaike's final prediction error (FPE) estimate (see the previously mentioned Technical Article of L. Ljung for a derivation thereof) and is expressed as $$J(M) = \frac{N + d_M}{N - d_M} V(\theta) \quad (21)$$

where $d_M$ is the total number of weights in the network, and N is the size of the training set.

According to eqn 19, as the size of the network is increased, the flexibility of the network is increased and a better fit can be made for the training data. Thus, V(θ) is a decreasing function of the number of weights in the network. If too much flexibility is added, noise in the data will also be captured with the properties of the training set in the network, and/or the data in the training set will merely be memorized and no generalization will occur in the training process. This is known as overfitting. A conventional solution to overfitting is to find the "optimal" network architecture (an architecture that minimizes J), for example, by "pruning" the network (see the technical article "Optimal Brain Surgeon and General Network Pruning," of Hassibi et al., published in Proc. of the 1993 IEEE Int. Conference of Neural Networks, San Francisco, pp. 293-299). Other solutions to overfitting include, for example, adding an extension to the cost function, called regularization (or weight decay) (see, for example, the technical article "Adaptive Regularization" of Hansen et al., published in the Proc. of the 1994 IEEE Neural Network in Signal Processing Workshop, Greece, and the technical article "Generalization Performance of Regularized Neural Network Models," published in the Proc. of the 1994 IEEE Neural Networks in Signal Processing Workshop, Greece)

Applications of the Model

Once the model is generated, it can be used to determine, predict or estimate various performance features of the aircraft, given an input to the neural network. For example, given a plurality of inputs (e.g., flap positions, slat positions, deflection angles, elevator deflections, rudder deflections, stabilizer position, roll, pitch, and yaw positions, angle of attack, and permutations of such geometric configurations, and power settings such as math number and velocity) the neural network can predict performance characteristics such as coefficients of lift, drag, side-force, pitching moment, yawing moment, and rolling moment ($C_L$, $C_D$, $C_Y$, $C_M$, $C_N$, $C_b$ respectively), and lift.

Conversely, the model can also be used to determine the optimal setting of certain geometric configurations and power setting. For example, the model can be used to determine the optimal flap settings at each angle of attack (α) that maximizes lift to drag ratio (L/D). A network having L/D as an output node, and α, leading edge flap (LE), and trailing edge flap (TE) as input nodes may be constructed (see FIG. 5). Then, for a given α, LE and TE are varied. The optimal output L/D is recorded for each setting of α, and the corresponding LE and TE noted.

Using the present invention, approximately 40 to 70 percent less wind tunnel data is required to derive a model of sufficient accuracy to analyze the aircraft performance. Thus, less wind tunnel test time is required, and design and development costs are significantly reduced. Using the present invention generates a highly accurate model almost equal to the noise level in the original measurement data (i.e., the error factor in measuring the performance features of an object in the wind tunnel). The model is generated and used in seconds, and can be run on desktop PC's. Conventional numerical aerodynamic modeling takes days or weeks and commonly requires a super-computing computer or equivalent.

REFERENCES

Fletcher, R. (1987): *"Practical Methods of Optimization"*, Wiley & sons, 1987.

Hagan, M. T. & M. B. Menhaj (1994): *"Training Feedforward Networks with the Marquardt Algorithm"*, IEEE Transactions on Neural Networks, Vol. 5, No. 6, November 1994, pp.989–993.

Hansen L. K., C. E. Rasmussen, C. Svarer & J. Larsen (1994): *"Adaptive Regularization,"* Proc. of the 1994 IEEE Neural Networks in Signal Processing Workshop, Greece.

Hassibi B., D. G. Stork & G. J. Wolff (1993): *"Optimal Brain Surgeon and General Network Pruning,"* Proc. of the 1993 IEEE Int. Conference on Neural Networks, San Francisco, pp. 293-299.

Hertz, J., A. Krogh & R. G. Palmer (1991): *"Introduction to the Theory of Neural Computation"*, Addison-Wesley.

Larsen, J. & L. K. Hansen (1994): *"Generalization Performance of Regularized Neural Network Models"*, Proc. of the 1994 IEEE Neural Networks in Signal Processing Workshop, Greece Ljung, L. (1987): *"System Identification, Theory for the User"*, Prentice-Hall.

Madsen, K. (1991): *"Lecture Notes on Optimization"* (in danish), Institute for Mathematical Modeling, DTU.

MathWorks (1994a): "*MATLAB-Users Guide*". MathWorks (1993): "*Optimization toolbox for MATLAB*". MathWorks (1994b) "*Neural Networks Toolbox for MATLAB*", The MathWorks, inc.

Moré, J. J. (1982): "*Recent Developments in Atgorithms and Software for Trust-Region Methods*", Technical memorandum No. 2, Argonne National Laboratory.

Sjöberg J. & L. Ljung (1992): "*Overtraining, Regularization, and Searching for Minimum in Neural Networks*", Preprints of the 4th IFAC Int. Symp. on Adaptive Systems in Control and Signal Processing, pp. 669–674, July 1992.

Sjöberg, J., H. Hjalmerson & L. Ljung (1994): "*Neural Networks in System Identification*", Proceedings 10th IFAC symp. on System Identification, Copenhagen, Vol. 2, pp. 49–71.

What is claimed is:

1. A method for generating a model of one or more flow performance features of an object in a flowing medium having a plurality of geometric configurations, the method comprising the steps of:

(a) forming a neural network comprising:
 a plurality of input nodes associated with the geometric configurations of an object,
 a plurality of hidden nodes,
 one or more output nodes associated with the flow performance features of the object, and
 a weight matrix for defining connections between the input nodes and the hidden nodes, connections between the hidden nodes and the output nodes, and weight values associated with each connection, (b) forming a test database, coupled to the neural network, comprising a plurality of test input signals and corresponding test output signals, the test input signals associated with the geometric configurations of the object and the test output signals associated with the flow performance features of the object, the test input signals associated with the input nodes and the test output signals associated with the output nodes, said weight values being modified as a function of said test input signals;

(c) solving for a search direction to obtain one of said flow performance features comprising the steps of:
 (i) initializing a parameter vector representative of a weight value of said one of said flow performance features;
 (ii) selecting a random predictor value for said one of said flow performance features and having an error cost function with a gradient; and
 (iii) iterating the parameter vector and random predictor value to determine said search direction, said determination being satisfied when qualifying one of the conditions selected from the group comprising:
  (1) the gradient of the error cost function is near zero,
  (2) the error cost function is below a predetermined value, and (3) a predetermined number of iterating of the parameter vector and random predictor value has been accomplished.

2. The method according to claim 1, wherein said error cost function is a mean square error cost function.

3. The method according to claim 2, wherein said mean square error cost function is based on all of the parameter vectors and random predictor values used for said iterating step.

4. The method according to claim 3, wherein said mean square error cost function is determined by an average generalization error technique.

5. The method according to claim 4, wherein said average generalization is established by a Akaike final prediction error (FPE) estimate.

6. The method according to claim 1, wherein said error cost function is a relative absolute error function.

7. The method according to claim 1, wherein said output nodes is selected to be of a number which exceeds the number of selected weight values.

8. The method according to claim 1, wherein the geometric configurations are selected from the group comprising leading edge flap, trailing edge flap, angle of attack, flap positions, slat positions, deflection angles, elevator deflections, rudder deflections, stabilizer position, roll, pitch, and yaw positions, angle of attack, mach number, and velocity.

9. The method according to claim 1, wherein the hidden nodes produce a tangent hyperbolic activation function signal.

10. The method according to claim 1, wherein the output nodes produce linear output function signals.

11. The method according to claim 1, wherein the flow performance features are selected from the group comprising of lift, drag, lift/drag ratio, side-force, pitching moment, yawing moment, rolling moment, and maximum lift.

12. The method according to claim 1, wherein a set of paired test input signals and corresponding test output signals are generated from wind tunnel testing of the object.

13. The method according to claim 1, wherein said iterating step is accomplished by a Levenberg-Marquard technique.

14. The method according to claim 1, wherein said iterating step is accomplished by a back-propagation technique.

15. The method according to claim 1, wherein said random predictor value is chosen from a Gaussian distribution.

* * * * *